United States Patent
Fluhrer

(12) 
(10) Patent No.: US 6,249,127 B1
(45) Date of Patent: Jun. 19, 2001

(54) METHOD AND CIRCUIT FOR CHECKING LEAD DEFECTS IN A TWO-WIRE BUS SYSTEM

(75) Inventor: Sven Fluhrer, Goeppingen (DE)

(73) Assignee: DaimlerChrysler AG, Stuttgart (DE)

( * ) Notice: Subject to any disclaimer, the term of this patent is extended or adjusted under 35 U.S.C. 154(b) by 0 days.

(21) Appl. No.: 09/102,629

(22) Filed: Jun. 23, 1998

(30) Foreign Application Priority Data

Jun. 23, 1997 (DE) ................................. 197 26 538

(51) Int. Cl.[7] ..................................................... G01R 31/00
(52) U.S. Cl. ............................................. 324/543; 324/537
(58) Field of Search ................................... 324/509, 510, 324/511, 522, 523, 527, 528, 557, 539, 540, 543, 73.1, 72.5; 714/40, 43, 735; 375/224; 327/63, 64, 65, 68, 69

(56) References Cited

U.S. PATENT DOCUMENTS

| | | | |
|---|---|---|---|
| 3,727,128 | 4/1973 | McFerrin | 324/533 |
| 3,833,853 | * 9/1974 | Milford | 324/537 |
| 4,144,487 | 3/1979 | Pharney | 324/52 |
| 4,151,459 | 4/1979 | Fayolle et al. | 324/52 |
| 4,165,482 | 8/1979 | Gale | 324/52 |
| 4,491,782 | 1/1985 | Bellis et al. | 324/52 |
| 4,728,898 | * 3/1988 | Staley, Jr. | 324/522 |
| 5,184,081 | 2/1993 | Oswald et al. | 324/533 |
| 5,781,585 | * 7/1998 | Doener et al. | 375/224 |

FOREIGN PATENT DOCUMENTS

| | | |
|---|---|---|
| 42 12 742 A1 | 10/1993 | (DE) . |
| 195 09 133 A1 | 10/1995 | (DE) . |

* cited by examiner

Primary Examiner—Safet Metjahic
Assistant Examiner—Vincent Q. Nguyen
(74) Attorney, Agent, or Firm—Crowell & Moring, L.L.P.

(57) ABSTRACT

A method for checking lead defects in a two-wire bus system compares the voltage levels on the two wires with certain threshold values, with the comparison being made with the threshold values in the dominant and recessive states. A circuit for performing the method has one input of a first comparator connected with one wire, an input of a second comparator connected with the other wire, and the other inputs of the first and second comparators each being subjected to a voltage that is between the two voltage values on the wires in the dominant and recessive states in normal operation. One input of a third comparator also is connected with one wire, and one input of a fourth comparator is connected with the other wire, with the other inputs of the third and fourth comparators each being subjected to a voltage that is above the maximum voltage value on the wires in the dominant and recessive states during normal operation. The outputs of the first and second comparators are supplied to a subtractor, with a voltage adaptation at the level of the output signal taking place. The output signal of the subtractor is supplied to the input of a fifth comparator, and the output signal of the subtractor also is supplied through a diode to the input of a window comparator. The outputs of the third and fourth comparators also are connected with the input of the window comparator.

4 Claims, 5 Drawing Sheets

FIG.4

| | DOMINANT | RECESSIVE | CASE 1:9 | | CASE 2:4 | | CASE 3 | | CASE 5 | | CASE 6 | | CASE 7 | | CASE 10 | | CASE 11 | | CASE 12 | |
|---|---|---|---|---|---|---|---|---|---|---|---|---|---|---|---|---|---|---|---|---|
| | | | D | R | D | R | D | R | D | R | D | R | D | R | D | R | D | R | D | R |
| H | 1 | 0 | 1 | 0 | 0 | 1 | 1 | 0 | 1 | 0 | 1 | 1 | 1 | 0 | 1 | 1 | 0 | 0 | 1 | 1 |
| L | 0 | 1 | 1 | 1 | 1 | 0 | 1 | 1 | 0 | 0 | 0 | 1 | 1 | 1 | 0 | 1 | 0 | 1 | 1 | 1 |
| 2.5 V | 0 | 0 | 1 | 0 | 0 | 0 | 0 | 0 | 1 | 0 | 1 | 0 | 0 | 0 | 1 | 0 | 1 | 0 | 0 | 0 |
| DIFF. | 1 | 0 | 0 | 0 | 0 | 0 | 0 | 0 | 0 | 0 | 1 | 0 | 0 | 0 | 1 | 0 | 0 | 0 | 0 | 0 |
| RATED OPERATION | | | | | | | | | | | | | | | | | | | | |

FIG.5

METHOD AND CIRCUIT FOR CHECKING LEAD DEFECTS IN A TWO-WIRE BUS SYSTEM

BACKGROUND AND SUMMARY OF THE INVENTION

This application claims the priority of German Application No. 197 26 538.3, filed Jun. 23, 1997, the disclosure of which is expressly incorporated by reference herein.

The present invention relates to a method and a circuit for checking lead defects in a two-wire bus system in which a check for lead defects in a two-wire bus system is performed by comparing the voltage levels on the two wires with certain threshold values. The comparison with the threshold values takes place in a dominant and a recessive state.

A method is already known (see German Patent document DE 42 12 742 A1) in which preferably two end stages of at least one bus subscriber are controlled. The voltages that prevail on the two wires of the bus system are checked by two control leads, with these two control leads being supplied though an A/D converter to the input of a microprocessor. In addition, a table of voltage values is provided which are established when the two end stages are controlled on the two wires of the two-wire bus system as a function of various defect cases. Defect cases of this kind can consist for example of a short circuit to ground, a short circuit to the potential of the supply voltage, a short circuit between the two wires, or a wire break. When the voltage values on the two wires are detected in the microprocessor, these voltage values are compared with the values provided in the table in order to unambiguously detect a possible defect and to locate it. Eight voltage values are provided for each of the two wires, depending on whether the system is operating free of defects or whether a defect is present, and if a defect is present, what type of defect it is. Further evaluation therefore becomes comparatively expensive because of the necessity for a comparison of each of the measured voltages with eight voltage values. Even if it is conceivable (something not described in detail in the cited reference, however) that this can be done by means of software in the microprocessor, this method is comparatively costly in design.

It is also known from German Patent document DE 195 09 133 A1 to link the two signal leads of the two-wire bus system to the inputs of comparators. A comparator is provided whose two inputs each receive one of the two signal leads. By means of this comparator, the voltage difference between the two signal leads is determined. In addition, two comparators are provided, to each of whose inputs one of the two signal leads is supplied and with the other input, in each case, receiving a reference voltage that corresponds approximately to the value $V_{cc}2$. From various combinations of the levels of the outputs of the comparators in the dominant as well as recessive states, certain defect situations such as short circuits to ground or to $V_{cc}$ can be detected. In addition, a decision can be made as to whether it is possible and/or advisable in certain situations to continue single-wire transmission using the intact lead.

The goal of the present invention is to expand the possibilities of defect detection.

According to the invention this is achieved by a method in which the voltages on the two wires are each compared with a voltage level that is above the maximum voltage value on the wires in the dominant and recessive states during normal operation.

As a result, it is possible to detect a short circuit of one or both wires to the system and/or battery voltage $U_{Batt}$. Otherwise, it is possible to detect only a short circuit to ground or to $V_{cc}$.

In contrast to the procedure in German Patent document DE 42 12 742 A1, it is advantageous that the checking of the voltage ratios in the two states defined requires fewer threshold values to perform the check. Otherwise, the check can be performed during normal transmission without a special test situation having to be created as described in DE 42 12 742 A1.

With the method according to the present invention, dimensioning is provided that allows the voltage levels on the two wires to be compared in the simplest case to detect a defect. Accordingly, the voltages on the two wires are each compared with a voltage level that is between the two voltage values on the wires in the dominant and recessive states during normal operation.

In a further advantageous method according to the invention, in combination with the method steps described or also according to the invention without these method steps, a comparison is made between the voltage differential between the voltages on the two wires in the dominant and recessive states, and predetermined threshold values. As a result, a possible defect can be further pinpointed.

Advantageously, a possible defect can be further pinpointed using the method according to a preferred embodiment of the invention, with the voltage differential between the voltages on the two wires being monitored for a first voltage level being exceeded, and for the voltage level lying within a window that is specified by a second and a third voltage level, with the first voltage level being above the second and third voltage levels.

A circuit according to the invention for working one of the above methods, has an input of a first comparator being connected with one wire and has an input of a second comparator being connected with the other wire. The other inputs of the first and second comparators each are subjected to a voltage that is between the two voltage values on the wires in the dominant and recessive states during normal operation. One input of a third comparator is connected with one wire, and an input of a fourth comparator is connected with the other wire. The other inputs of the third and fourth comparators each are subjected to a voltage that is above the maximum voltage value on the wires in the dominant and recessive states during normal operation. The outputs of the first and second comparators are supplied to a subtractor, with voltage adaptation of the level of the output signal taking place. The output signal of the subtractor is supplied to the input of a fifth comparator. The output signal from the subtractor also is supplied through a diode to the input of a window comparator. The outputs of the third and fourth comparators are connected with the input of the window comparator.

With this circuit, therefore, a distinction can be made between various defects, with the number of voltage comparators being advantageously limited relative to the previously known prior art.

In an improvement on the circuit according to the present invention, the outputs of the first, second, and fifth comparators as well as of the window comparator are evaluated in order to determine the state of the wires.

By evaluating the outputs of the comparators, it is advantageously no longer necessary to determine the voltage by means of an A/D converter, which is advantageous as far as cost is concerned. Furthermore, at the voltage levels that can be set as threshold values according to the present invention, it turns out that these voltage levels are located much further apart than shown in the table in German Patent document DE 42 12 742 A1 to distinguish the individual defects. A difference in the voltage level on the order of several tenths of a volt for example can be caused by a ground mismatch that results in a poor contact with ground.

Hence, the solution according to the invention considerably increases accuracy in pinpointing a defect that occurs.

Other objects, advantages and novel features of the present invention will become apparent from the following detailed description of the invention when considered in conjunction with the accompanying drawings.

BRIEF DESCRIPTION OF THE DRAWINGS

FIG. 4 is a matrix of combinations of TTL logic levels, and FIG. 5 is a matrix reduced to the defects.

DETAILED DESCRIPTION OF THE DRAWINGS

Figure 1:
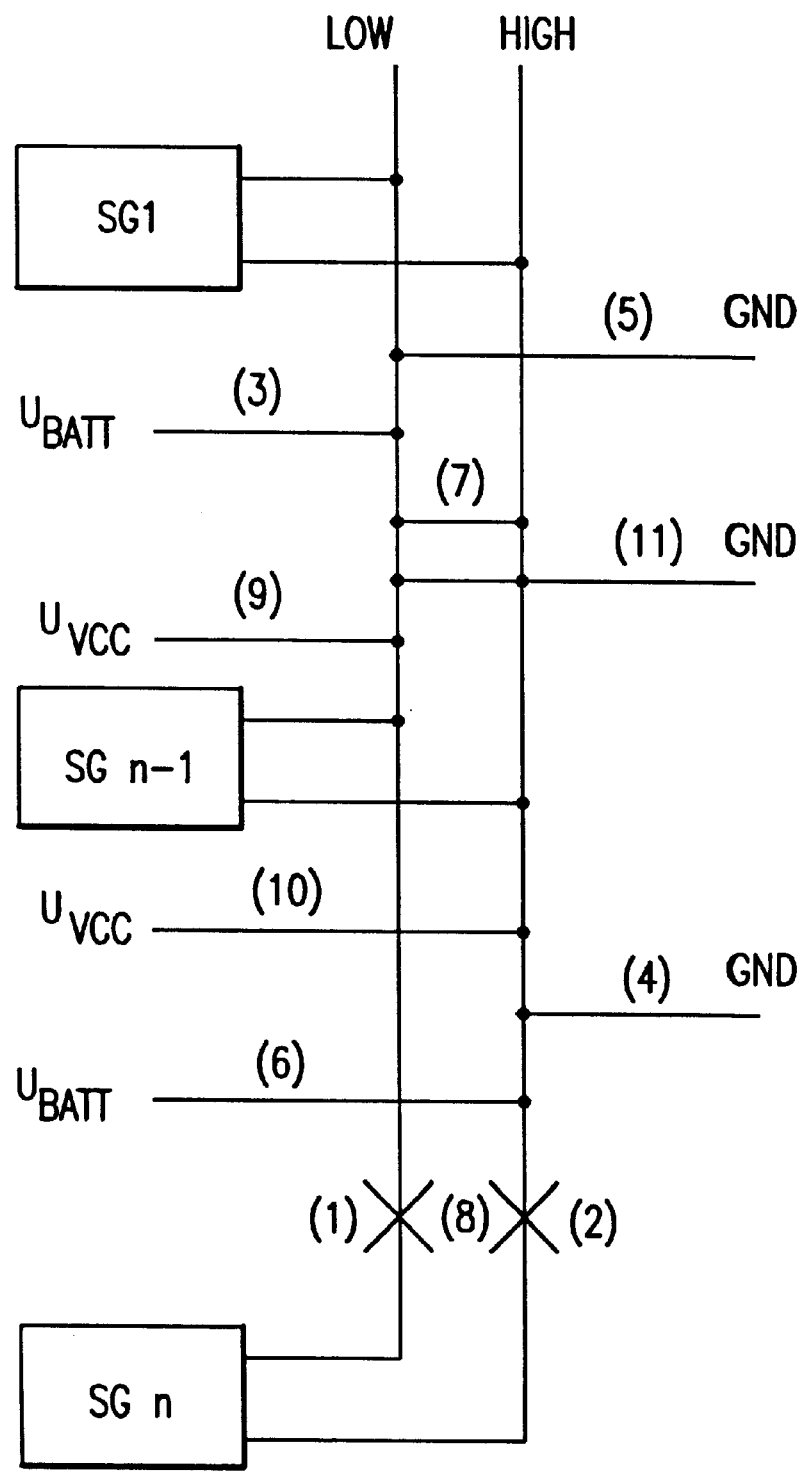
FIG. 1 is a view of a two-wire bus system with possible defects.

FIG. 1 shows a view of a two-wire bus system with possible defects. The two bus wires are marked low and high. Various control devices can be connected to these two bus wires that exchange data over the bus system. In the view in FIG. 1 for example, control devices $SG_1$, $SG_{n-1}$, and $SG_n$ are shown.

A variety of defects is also shown, listed briefly below:
Defect 1: broken wire in "low" bus wire;
Defect 2: broken wire in "high" bus wire;
Defect 3: short circuit of "low" bus wire to the system voltage and/or battery voltage watt;
Defect 4: short circuit of "high" bus wire to ground;
Defect 5: short circuit of "low" bus wire to ground;
Defect 6: short circuit of "high" bus wire to line voltage and/or battery voltage $U_{Batt}$;
Defect 7: short circuit between the two bus wires "low" and "high";
Defect 8: broken wire in the two bus wires "low" and "high";
Defect 9: short circuit of "low" bus wire to voltage $V_{cc}$;
Defect 10: short circuit of "high" bus wire to voltage $V_{cc}$;
Defect 11: short circuit between the two bus wires "low" and "high" and to ground.

In the CAN field bus range, defect-tolerant end stages (transceiver and/or physical layer) have been used from the beginning. These end stages evaluate the signals in the information transmission medium and process them in the event of a line defect in such a manner that a protocol module that transmits and receives a signal with a microcontroller connected downstream is not required to perform any additional defect processing, and in the most favorable case no information is lost. The bus defects to be processed in the defect-tolerant transceiver are largely a partial area of CAN specification V2.0 ISO/DIS 11519 Part 1 and ISO/DIS 11898 "Bus failure management" as well as Chapter 11. FIG. 1, according to the nomenclature selected there, shows bus failures 1 to 8 among the corresponding defects with numbers 1 to 8. In addition, in the embodiment shown here, defects 9, 10, and 11 have also been added that can likewise occur during operation (for example during system setup or as a result of aging) and should be detected if possible.

Figure 2:
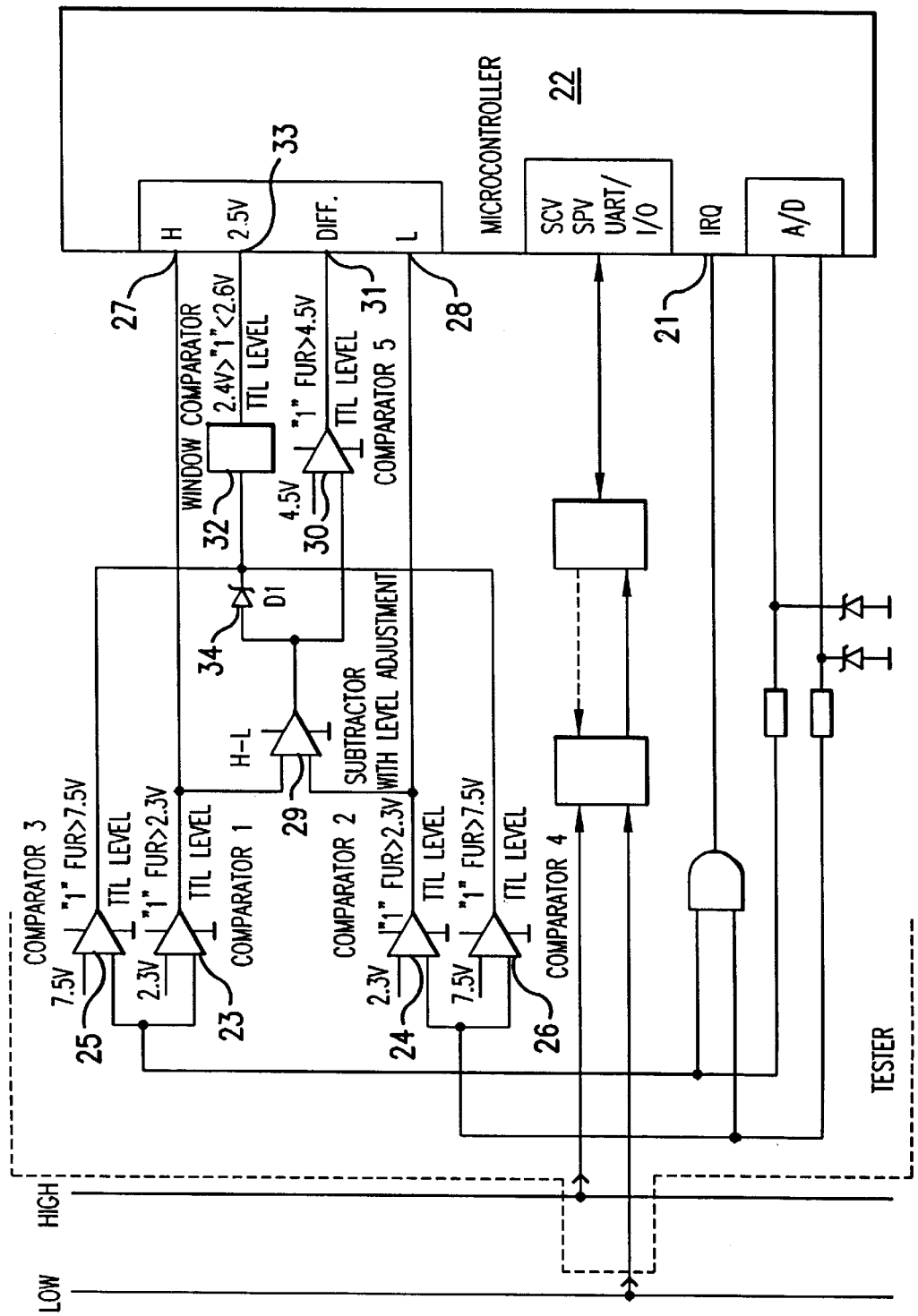
FIG. 2 shows a schematic circuit for performing the method according to the invention.

FIG. 2 shows a circuit for performing the method. For the fault diagnosis according to the invention, the battery must be connected to the terminals in the embodiment of a CAN bus system in a motor vehicle. In addition, all control devices must be activated, for which purpose the ignition must be switched on.

Initially the bus is stimulated to reach a specific initial state. The control devices are activated as a result. Stimulation is performed by controlling two transistors that supply a dominant signal for a certain period of time to the two bus wires (low and high). The duration of the stimulation depends on the protocol and transceiver module.

The process is then launched by the first dominant bit of a message on the bus to which the IRQ (interrupt) input 21 of microcontroller 22 reacts.

Initially each level of the two wires is considered separately. By means of comparators (comparator Komp. 1 with reference number 23 for the H lead, comparator Komp. 2 with reference number 24 for the L lead) a decision is made as to whether the signal level corresponds to a logical "0" or a logical "1." As a result, the bus level is normalized to the TTL level.

If the bus level exceeds the threshold (7.5 V) of the comparators Komp. 3 with reference number 25 for the H lead and Komp. 4 with reference number 26 for the L lead, an additional signal with the logical value of "1" is provided for defect evaluation. If the level is below 7.5 V, this corresponds to a logical "0."

The two outputs of comparators Komp. 1 and Komp. 2 (23 and 24) are supplied directly to I/O ports 27 and 28 of microcontroller 22.

In addition, the output signals of comparators Komp. 1 and Komp. 2 (23 and 24) are supplied to the inputs of a subtractor 29 that forms a difference signal. This difference signal is then reduced in bandwidth from −5V to +5V to −2.5V to +2.5V and raised to the range 0V to +5V.

The output signal of this subtractor 29 is again converted by comparator Komp. 5 (30) into a TTL level that likewise is supplied to an I/O port 31 of microcontroller 22.

During the differential formation of the signals of comparators 23 and 24, in addition to the pure TTL signals, "half signals" on the order of 2.5 V also form. A logical value of "1" is assigned to the signals of this order of magnitude by means of a window comparator 32, said value also leading directly to an I/O port 33 of microcontroller 22. In order to be able reliably to detect short circuits of the H line or the L line to a potential greater than 7.5 V, the window comparator must be switched off by superimposing the signal levels of comparators 25 and 26. Diode 34 serves to decouple subtractor 29 and the outputs of comparators 25 and 26.

Field bus protocols usually begin with an SOF (start of frame) or SOM (start of message), each of which is a dominant bus signal. The start sequence is followed as a rule by an identifier with different level changes (dominant, recessive). The dominant start sequence is sufficient for measurement, followed by a transition to the recessive state. These two level states (dominant, recessive) and the resultant difference signals and 2.5 V signals create a matrix on the basis of which most defects can be unambiguously recognized.

Figure 3:
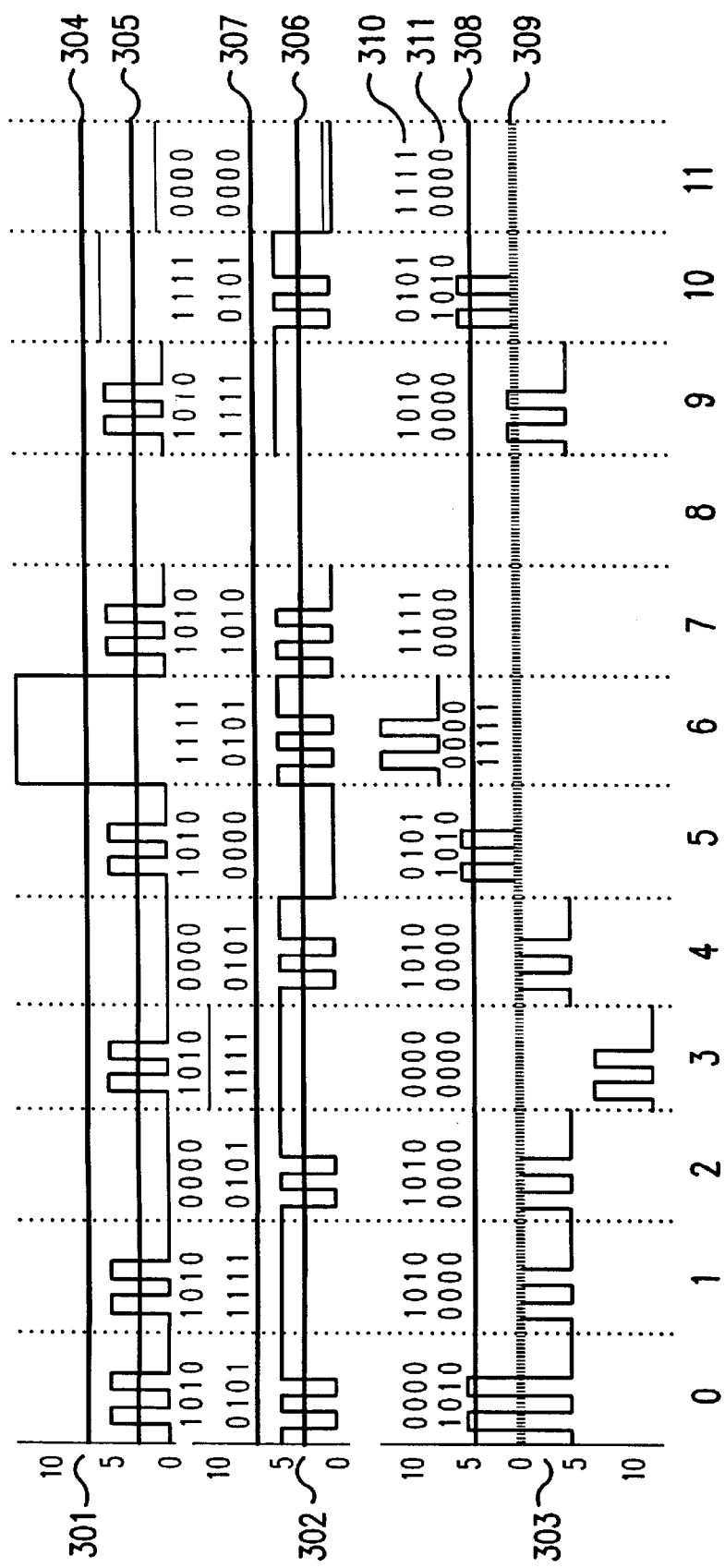
FIG. 3 is a signal diagram showing the signals of the individual relevant bus defects.

FIG. 3 shows the signals of the individual relevant bus defects that can occur with the respective corresponding TTL levels. 301 represents the signal curve on the H line and 302 represents the signal curve on the L line while 303 represents the signal curve of the difference signal.

The various situations are shown in the x direction. 0 is then used to represent fault-free normal operation and situations 1 to 11 correspond to the errors with the numbers according to FIG. 1.

In 301, the threshold values of comparators 25 and 23 are recorded that are at 7.5 V and 2.5 V. These threshold values are marked 304 and 305. The sequence of TTL levels given in conjunction with 301 are the levels that occur at I/O port 27 of microcontroller 22 and correspond to the output of comparator 23.

In 302, the threshold values of comparators 24 and 26 are shown, which are likewise at 2.5 V and 7.5 V. These threshold values are marked 306 and 307. The sequences of TTL levels given in conjunction with 302 are the levels that occur at I/O port 28 of microcontroller 22 and correspond to the output of comparator 24.

In 303, the threshold value of comparator 30 is shown, which is at 4 V and is marked 308. 309 represents the voltage range of window comparator 32 which is at 0.0 V. At these two threshold values, there are deviations in the representation of FIG. 3 from the sample circuit in FIG. 2. This is due to the fact that in the sample circuit in FIG. 2, the output signal from the subtractor is initially halved and then increased by 2.5 V. On the other hand, FIG. 3 shows the voltage ratios without this "conversion." Two sequences of TTL levels are provided in conjunction with 303. The sequences marked 310 correspond to the output of window comparator 32 and are applied to I/O port 33 of microcontroller 22. The sequences marked 311 correspond to the output of comparator 30 and are applied to I/O port 31 of microcontroller 22.

It is clear that the corresponding sequences of TTL levels differ from one another in the individual defects, so that the individual defects can be distinguished from one another. The defect numbered 8 (both bus wires broken) cannot be determined independently of the protocol. For this defect, it is necessary to examine the set and actual configurations of the system, or a corresponding protocol module must be provided that can "listen in" on the bus.

Figure 4:
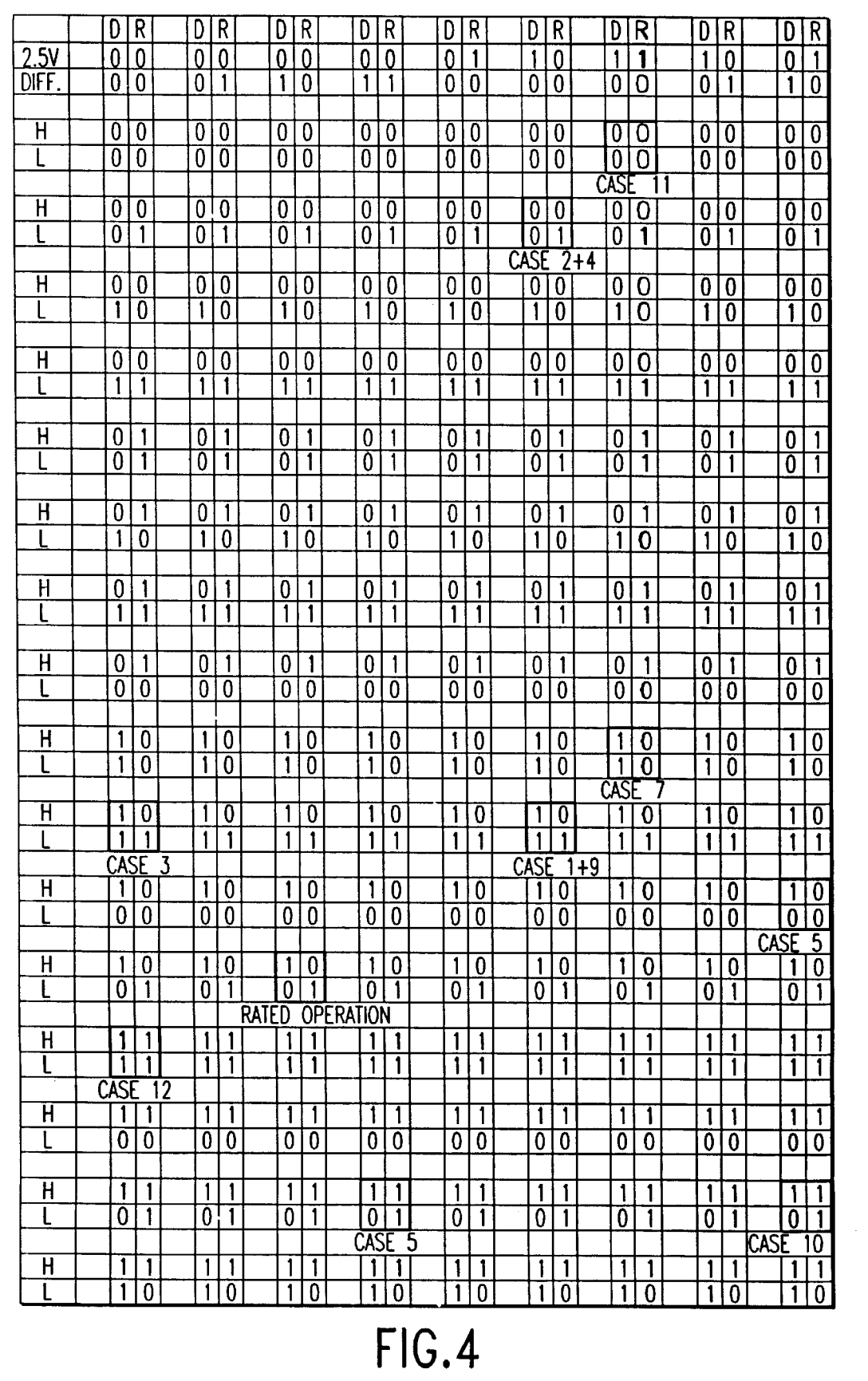

FIG. 4 shows a matrix of all combinations of TTL levels. The signal at I/O port 33 of microcontroller 22 forms the first line of the uppermost double line of the matrix. The signal at I/O port 31 of microcontroller 22 forms the second line of the uppermost double line of the matrix. The other double lines of the matrix contain various combinations of TTL levels at I/O ports 27 and 28. In each double line, the TTL levels are plotted for both the dominant and recessive states. The individual defects correspond to certain combinations of the TTL levels that are labeled accordingly in FIG. 4. The label "case" with the corresponding number refers to the individual defects. A procedure for determining the corresponding defects from the TTL levels recorded can consist for example of initially finding the column whose upper double line corresponds to the TTL levels recorded at I/O ports 33 and 31. Then the lines that correspond to the TTL levels recorded at I/O ports 27 and 28 are determined, so that the defect can be pinpointed. It is also possible to proceed the other way around, in other words to determine the line first and then the corresponding column.

Likewise it can be determined from this matrix that the defect can be pinpointed with only a few measured values but cannot be determined absolutely accurately and unambiguously. In any case, however, normal operation (rated operation) can be distinguished from the defects, since no defect is marked both in the same column and in the same line of the normal operation. These combinations of TTL levels are therefore theoretical combinations that cannot occur in the case of the defects mentioned. Therefore, if only the signals at I/O ports 27 and 28 are evaluated for example, defect 3 cannot be distinguished from defects 1 and 9 for example. Likewise it is not possible to distinguish between defects 6 and 10. On the other hand, if only I/O ports 31 and 33 are evaluated, it is not possible to distinguish between defects 1, 2, 4, and 9 as well as defects 7 and 11 as well as defects 5 and 10.

As for the sequence of TTL levels, normal operation is therefore treated like any defect.

FIG. 5 shows a reduced matrix in which the sequence of TTL levels of the individual defects as well as those of the normal operating state are indicated. A list of this kind can be used for example in the microcontroller for evaluation as a comparative list. If additional defects are to be investigated, the matrix need only be expanded accordingly. Possible examples would be the high and low leads being short-circuited to one another and to $U_{Batt}$. This defect is provided for in the drawing in FIG. 4 and in FIG. 5 as defect 12. Likewise, the defect of a ground mismatch starting at 2.3 V could also be added.

It is also evident that individual defects are present that have the same sequence of TTL levels, but which have a different cause. This applies to the pair of defects 1 and 9 as well as 2 and 4. These defects however differ in terms of the time that they appear. Defects 1 and 2 (cable break in a lead) are so-called local defects and occur only in the transmitter of a station affected by a defect. Defects 4 and 9 (short-circuit defects) are general defects and permanently affect the bus. For example, if ten successive measurements are performed and the same defect state is found each time, a stationary bus defect is present and the defect can thus be determined unambiguously.

It is also possible to perform another supplementary check using the A/D inputs of the microcontroller.

In another embodiment, the circuit can be integrated for example into a tester that uses an integrated display or an interface with a printer to output a test protocol indicating that a defect has been found. Local pinpointing of a short circuit can also be indicated provided it is located closer.

In addition to the connection to the LOW and HIGH leads, a tester of this kind can have a connection to the $U_{Batt}$ lead for the power supply. It is also possible however to optionally provide a battery as an energy source. It is only necessary to fulfill the condition that the voltage in the battery be greater than $V_{cc}$.

This tester must also have a connection to ground. All the control devices connected to a field bus evaluate the signals on the data leads relative to ground or require a reference potential for ground. Depending on the signal drivers used in each case, ground mismatches within a system can be tolerated up to a certain bandwidth. For detection of defects in the leads within such a system, the same reference potential is required in the tester for ground as for all other subscribers. For unambiguous and reproducible measurements, the absolute ground of the bus system is required that corresponds to the minus pole of the battery in the motor vehicle.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for checking lead defects in a two-wire bus system, comprising the steps of:

detecting a voltage level of a first wire and a voltage level of a second wire of said two wire bus system;

comparing the voltage level detected on the first wire and the voltage level detected on the second wire with a threshold voltage level that is greater than a predetermined maximum voltage level on the two wires in the dominant and recessive states during normal operation;

comparing the voltage level detected on the first wire and the voltage level on the second wire with a second threshold voltage that is between a first voltage value on a first wire of the two wires and a second voltage value on a second wire of said two wires in the dominant and recessive states during normal operation; and subtracting the results of the comparisons of the voltage level of the first wire and the voltage level of the second wire with said second threshold voltage.

2. The method according to claim 1, further comprising the step of monitoring the voltage differential between the voltages on the two wires for exceeding a first voltage level depending on whether the voltage level is within a window set by a second and a third voltage level, with the first voltage level being above the second and third voltage levels.

3. A circuit for checking lead defects in a two-wire bus system by comparing measured voltage levels on two wires with certain threshold values, comprising:

a first comparator having one input connected with one of said two wires;

a second comparator having an input connected with the other of said two wires, wherein the other inputs of the first and second comparators are each subjected to a voltage that is between a first voltage value on a first wire of the two wires and a second voltage value on a second wire of said two wires in the dominant and recessive states during normal operation;

a third comparator having an input connected with one of said two wires;

a fourth comparator having an input connected with the other of said two wires, wherein the other inputs of the third and fourth comparators are each subjected to a voltage that is above a maximum voltage value of each of the two wires in the dominant and recessive states during normal operation;

a subtractor connected to and receiving outputs from the first and second comparators, the subtractor performing a voltage adaptation of the level of the output signal;

a fifth comparator receiving an output signal from the subtractor;

a window comparator receiving, at an input, the output signal from the subtractor; and wherein outputs of the third and fourth comparators are also connected to the input of the window comparator.

4. The circuit according to claim 3, wherein outputs of the first, second and fifth comparators, as well as of the window comparator are evaluated in order to determine a state of the two wires.

* * * * *